United States Patent [19]

Schanin et al.

[11] Patent Number: 5,239,255
[45] Date of Patent: Aug. 24, 1993

[54] PHASE-CONTROLLED POWER MODULATION SYSTEM

[75] Inventors: David J. Schanin, San Carlos; Richard R. Billig, Los Gatos, both of Calif.

[73] Assignee: Bayview Technology Group, San Carlos, Calif.

[21] Appl. No.: 659,101

[22] Filed: Feb. 20, 1991

[51] Int. Cl.$^5$ .............................................. G05F 5/02
[52] U.S. Cl. .................................... 323/237; 323/246; 323/300; 323/320; 361/91; 361/111
[58] Field of Search ............... 323/237, 242, 246, 300, 323/320, 326; 361/90–92, 111

[56] References Cited

U.S. PATENT DOCUMENTS

| | | | |
|---|---|---|---|
| 4,528,494 | 7/1985 | Bloomer | 323/237 |
| 4,540,893 | 9/1985 | Bloomer | 307/248 |
| 4,567,425 | 1/1986 | Bloomer | 323/237 |
| 4,617,508 | 10/1986 | Bloomer | 323/237 |
| 4,633,161 | 12/1986 | Callahan et al. | 323/242 |
| 4,688,161 | 8/1987 | Covington | 323/235 X |
| 4,823,069 | 4/1989 | Callahan et al. | 323/242 X |
| 4,975,629 | 12/1990 | Callahan et al. | 323/235 |
| 5,004,969 | 4/1991 | Schanin et al. | 323/235 |
| 5,038,081 | 8/1991 | Maiale, Jr. et al. | 323/326 X |

Primary Examiner—Emanuel T. Voeltz
Attorney, Agent, or Firm—Anderson & Hirsch

[57] ABSTRACT

A phase-controlled power modulation system switches modes in response to circuit-threatening conditions to avert the necessity of a shutdown. Normal operation is in reverse phase control (RPC) mode. When an inductive load sensor detects the presence an inductive load, the system switches to a forward phase control (FPC) mode (FPC) to minimize voltage spikes that would otherwise result from the load's opposition to voltage transitions. When an overcurrent sensor detects an overcurrent, the system switches into an asymmetric hybrid mode (AHPC) to maximize delivered power while remaining within switch current handling capacity. In AHPC mode, an RPC component of a half-cycle waveform is cut off at the current limit, while an FPC component of the same half-cycle waveform is triggered after the source voltage drops to a confidence threshold below the current limit to ensure that current limiting is not triggered again during the same half-cycle. In response to excessive temperature, a short transition mode is entered to reduce the heat generated at the switches until the temperature abates.

23 Claims, 5 Drawing Sheets

PHASE-CONTROLLED POWER MODULATION SYSTEM

BACKGROUND OF THE INVENTION

The present invention relates to electronic circuits and, more particularly, to a phase-controlled power modulation system. A major objective of the present invention is to provide for improved power control during a circuit-threatening condition of a phase-controlled (PC) power system, for example, of the type used as dimmers in lighting installations.

The ability to modulate the electrical power delivered to a load has been a requirement in both commercial and industrial applications. In particular, lamp dimmers in the commercial and entertainment lighting fields have been driven by the requirements of lighting designers for flexible and reliable control, along with the public demand for sophisticated special effects. These forces have motivated the development of modern phase control solutions for the control of incandescent lighting.

Phase controlled systems modulate delivered power by decoupling a load from an alternating current (AC) source for a fraction of each half cycle. Longer decoupling lowers delivered power, while shorter decoupling increases delivered power. Maximum power is delivered when there is no decoupling. Forward phase control (FPC) systems modulate power by decoupling at the beginning of each half cycle. Of the power associated with a half-cycle, only that fraction associated with the portion of the power curve occurring after coupling is delivered to the load. On the other hand, reverse phase control (RPC) systems begin each cycle with the load coupled to the power source. A power level below maximum is achieved by decoupling at the appropriate phase before the end of the half cycle. Both FPC and RPC systems have been implemented, although RPC is presently favored because it is less subject to noise generated by incandescent lamps due to mechanical resonance, commonly known as "lamp sing".

Phase control is typically implemented using a switch assembly with two complementary switches. Earlier FPC systems use an inverse parallel pair of silicon controlled rectifiers (SCRs). A magnetic choke is required in series with the SCRs to limit the rate of rise of the voltage at turn-on to avoid electromagnetic interference (EMI) and radio frequency interference (RFI), and to reduce noise. For example, a choke would establish a minimum transition time of 400 $\mu$sec. Magnetic chokes are relatively heavy and expensive and thus undesirable, especially in applications such as theater lighting that require independent dimming of many lights.

More recently, phase control has been achieved by switch assemblies having a pair of voltage-controlled switches (VCSs) in inverse series relationship. Typically, VCSs can be insulated-gate bipolar transistors (IGBTs) or metal-oxide silicon field-effect transistors (MOSFETs). The transition time of these VCSs can be controlled as these switches pass through their active region to mimic the action of the choke used with SCR switches. For example, the transition through the active region of a VCS can be set to about 400 $\mu$sec to minimize interference and noise. Accordingly, chokeless and thus more economical and compact dimmer systems have been achieved.

Power control systems are subject to a variety of conditions since a variety of power sources and loads can be coupled through the switches. VCSs, even more so than their predecessors, are subject to damage or performance impairment by a variety of device-threatening conditions. These include excessive currents, voltages and temperatures.

Accordingly, practical power control systems using VCSs include protective circuits that handle these threatening conditions. In some cases, these circuits shut down operation until the condition is removed. Preferably, however, operation is altered in some way to permit the power control system to continue functioning, albeit with tradeoffs.

An example of a device-threatening condition is an excessive current (overcurrent) caused, for example, by a short circuit or a large load. Such an excessive current can destroy the VCSs. Therefore, some overcurrent protection, generally a current limiter, is provided in a VCS power control system. A tradeoff of current limiting is noise generated with the sharp waveform transitions caused by limiting.

A complex overcurrent situation occurs when bringing an incandescent lamp from a non-incandescent state to an incandescent state. The cold resistance of an incandescent lamp filament typically increases by an order of magnitude as the lamp incandesces and the filament heats. As a result of this phenomenon, surge currents of over 10 times the steady state requirements are encountered when a non-incandescing incandescent lamp is energized. In prior art SCR/choke dimmers, these surge currents are tolerated through the use of the choke to reduce their magnitude, and by overspecifying the SCRs and circuit protection devices (circuit breakers or fuses) used for a particular application, i.e. 20 Amp dimmers typically require 40 Amp SCRs. This solution is expensive, and also shortens the life of the bulb as associated tremendous surge currents cause physical stress to the lamp filament.

One might presume, therefore, that in a dimmer employing VCSs, this problem can be solved simply by setting the current limit for the dimmer to that required for lamp incandescence, i.e. 10 times the steady state value. Unfortunately, this is impractical, +VCSs able to operate at these current levels would be prohibitively expensive and result in a non-competitive product. However, setting the current limit only at the relatively low steady state current draw of the lamp will not allow the dimmer to deliver sufficient energy to a cold lamp to cause it to incandesce in an acceptable time period. Clearly, a mechanism that will allow a low current limit setting, yet ensure timely cold lamp response, is required.

Voltage limiting is also required to avoid damage and performance impairment by excessive voltages. Certain load types, namely inductive loads operating on an RPC dimmer, can induce voltage surges that require voltage limiting. Known voltage limiting devices limit voltage by converting excess voltage to heat, which must then be dissipated. The conversion of voltage to heat represents a loss of efficiency. Furthermore, the heat sinking required to dissipate the heat can add considerably to the bulk and expense of a power control unit. Finally, the heat so generated can contribute to a threat of thermal damage to the circuit, discussed immediately below.

Excessive heat can damage and impair the performance of a phase-controlled switching system. Where the switching system is colocated with the luminaire it is controlling, its ambient temperature can be very high since over 95% of the energy of a typical incandescent lamp is dissipated as heat. In addition, the nature of theatrical and architectural lighting typically requires that the luminaire be located at some height above the floor, therefore being located in a thermally hot portion of an enclosed room. Finally, installation errors can block the convection currents necessary to allow for cooling of a non-forced air cooled dimmer.

Whether or not the switching system is colocated with its luminaire, heat is generated by the switch assembly due both to conductive losses and to transition losses. As noted above, heat can also be generated by limiting devices.

As previously described, lamp sing and EMI/RFI are controlled by maintaining the VCS in its active region for the transition period. Since the VCS is actually functioning as a voltage-controlled resistor during this time, the VCS semiconductor junction is subjected to a very large thermal pulse. This thermal pulse is a function of the current through, voltage across, and the transition time of the VCS. During normal operation, the VCS components can be sized to handle the worst case thermal pulse. However, during overcurrent limits as described above that would be required to allow a cold lamp to incandesce, the increased current can cause excessive thermal pulses. U.S. Pat. Nos. 4,633,161 and 4,823,069, both to Callahan et al., claim that the solution to this problem is to reduce the transition time in response to an overcurrent situation. This is an unacceptable solution since it results in increased lamp noise during warmup, a period when the lamp is naturally noisier than normal due to the thermal and mechanical stresses that occur as the filament incandesces.

Dissipation of the heat so generated can be degraded by excessive ambient temperature, impeded air flow, or incorrect installation. The resulting heat accumulation can damage the switch assembly. Thermal protection can be implemented by sensing temperature and shutting down a system before damage occurs. The obvious tradeoff is that shutdown can be very inconvenient.

Electrical noise can also be device threatening. Electrical noise can be generated by sharp transitions in electrical voltage. This noise can affect the microcontroller of a microcontroller-based dimmer system, possibly causing erroneous actions. For example, noise can mask an indication requiring a shutdown; the resulting failure to shut down, e.g., in response to an overcurrent or overvoltage, can result in damage to the switches. Prior art attempts to limit electrical noise have involved controlling the transition rate of the switches. Nonetheless, the remaining noise can be unacceptable.

Thus, the prior art provides a variety of schemes for addressing device and performance-threatening conditions. However, these schemes generally involve undesirable tradeoffs. What is needed is a power control system that provides the necessary protective measures while minimizing performance impairment when these measures are functioning.

SUMMARY OF THE INVENTION

In accordance with the present invention, a phase-controlled power modulation system comprises a switch assembly, a phase controller, a transition shaper, a switch protector and an asymmetric waveform selector. The switch assembly alternately couples and decouples a load from an AC power source to implement phase-controlled power modulation. The phase controller determines the timing for the switch operations. The transition shaper controls transition profiles during switch operations. The switch protector detects circuit-threatening conditions and provides for a protective response thereto, which can include shutdown. The asymmetric waveform selector receives threat indications from the switch protector and selects a waveform change designed to minimize the indicated threat. The invention provides for alternate realization depending on the circuit-threatening situation. In practice, more than one realization of the present invention can be incorporated in a single embodiment.

One realization addresses overcurrents. An excessively large load can draw enough current to damage the switch assembly, which can be a pair of MOSFETs in inverse series arrangement. Practical phase-controlled power modulation systems include a current limiter to avoid this damage. A current limiter can include a resistor in series with the switches to provide a voltage representation of the current. When this voltage exceeds a predetermined threshold, a current overage is detected. The current limiter can then protect the switch assembly by decoupling the load from the power source.

The present invention also uses the current overage detection to switch from one asymmetric waveform mode to another. During normal operation, forward, or preferably, reverse phase control is implemented. In response to a current overage detection, an asymmetric hybrid phase control (AHPC) mode is entered. The AHPC mode is characterized by the superposition of a forward phase waveform and a reverse phase waveform. The reverse phase waveform begins each half cycle. When the AC voltage rises to a level drawing an excessive current, the switch assembly turns the current off. However, the switch assembly turns on again once the AC voltage drops sufficiently below the overage threshold. Since the forward phase component initiates at a voltage lower than the voltage at which the reverse phase terminates, the total half-cycle waveform is necessarily asymmetric.

The switch from a simple phase control, preferably reverse phase control, to a hybrid phase control facilitates warm up of incandescent lighting. Cold incandescent filaments have less resistance than filaments hot enough to incandesce. Thus, incandescent filaments represent a larger load during warm up. If this larger load causes a current overage, the resulting current limiting has the effect of prolonging warmup and delaying incandescence. By switching to an asymmetric hybrid waveform, the present invention pumps energy through the filament both at the beginning and the end of each half cycle without exceeding the current limit. Thus, the filament can warm up faster under current overage conditions and the incorporating lamp can be illuminated more quickly.

Another realization of the invention addresses voltage overages. Voltage protection can be implemented, for example, with a zener diode or a metal-oxide varistor (MOV) that serves both to detect and limit voltage overages. The present invention adds to such a voltage limiter additional voltage overage detection circuitry. In response to detection of a voltage overage, the present invention provides for a switch from RPC to FPC.

The switch to FPC is useful for handling inductive loads, such as fluorescent lamps. A charged inductive load opposes voltage changes. When RPC is employed, an inductive load is charged during the interval before a steep turn-off transition. The stored energy is then discharged back into the switch assembly upon turn off, causing a voltage spike. Such spikes can be used to indicate the presence of an inductive load.

When FPC is employed, the switch assembly is off before a steep turn-on transition. Thus, the inductive load does not have a store of energy to discharge during the transition. Thus, voltage spikes can be minimized by the switch to FPC when an inductive load is indicated.

The present invention also addresses heat build up. An indication of excessive heat can be used to trigger a switch between a long switch transition time and a short switch transition time. Normally, the longer switch transition time is preferred for its low noise characteristics. However, the time period in which a switch element is in its active region is longer. The preferred switches, i.e., MOSFETs and IGBTs dissipate more heat when in their active operating region than when in their saturated mode and than when in their depleted mode. The amount of heat generated by such switches can be reduced by shortening the time spent in their active regions. This shortening can be effected using a shorter transition time, at least until temperatures have dropped to an acceptable level.

Electrical noise is addressed by minimizing sharp transitions in the output voltage. The desired smoothness is established by maintaining an output voltage transition characterized by a negative average second derivative. This characteristic is maintained as long as a MOSFET or IGBT is in its active region. Thus, noise is minimized along with the chances of interference with controller operation that could damage the switch assembly.

The architecture of the present invention provides for transition control during both normal operation and protective mode. To this end, the transition shaper is located functionally between the phase controller and the switch assembly. Contrast this with U.S. Pat. No. 4,633,161 to Callahan in which current limiting overrides transition control (ramp). This causes Callahan to lose the advantages of transition shaping during protective mode, and denies the viability of implementing a dedicated waveform to minimize negative consequences of either the threat or the negative side-effects of a response to an indicated threat.

In summary, the present invention provides for improved response to circuit-threatening current, voltage, heat and noise. Since all these factors typically affect all power modulation systems, the present invention provides for the combination of its realizations in a single phase-controlled power modulation system. These and other features and advantages of the present invention are apparent from the description below with reference to the following drawings.

DESCRIPTION OF THE PREFERRED EMBODIMENT

Figure 1:
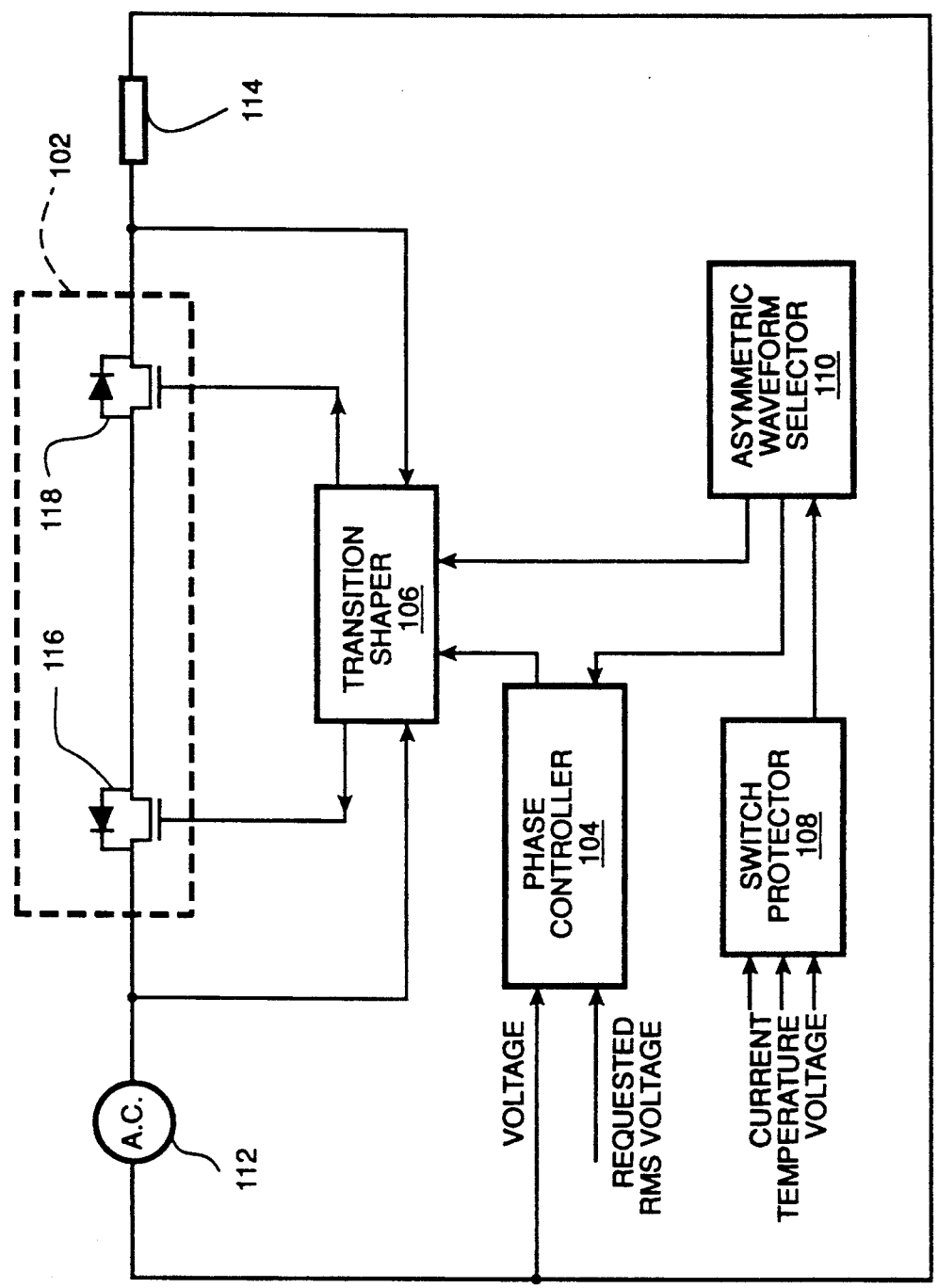
FIG. 1 is a functional block diagram of a phase-controlled power modulation system in accordance with the present invention.

In accordance with the present invention, a phase-controlled power modulation system 100 functionally comprises a switch assembly 102, a phase controller 104, a transition shaper 106, a switch protector 108 and an asymmetric waveform selector 110. The purpose of system 100 is to modulate the power from an AC source 112 delivered to a load 114.

The function of switch assembly 102 is to alternately couple and decouple load 114 from power source 112 to allow the AC delivered to load 114 to be modulated. As indicated, switch assembly 102 includes a pair of MOSFETs 116 and 118 in inverse series relationship. Since its body diode is forward biased only during a negative half cycle, MOSFET 116 controls power during positive half-cycles; similarly, MOSFET 118 has a body diode which is forward biased only during a positive half cycle, and thus controls power during negative half cycles of the AC waveform. Both switches 116 and 118 can be held on when full power is required.

Depending on the phase relationship between the AC waveform generated by AC source 112 and the timing of drive signals received at the gates of MOSFETs 116 and 118, switch assembly 102 can be operated in FPC mode, RPC mode and AHPC mode. During FPC mode, MOSFET 116 is off at the beginning of a positive half cycle, and is turned on at a time that the remaining AC waveform is calculated to provide the requested delivered RMS voltage. In RPC mode, MOSFET 116 is on at the beginning of a positive half cycle and is turned off when the requested RMS voltage has been achieved. In AHPC mode, MOSFET 118 starts on, turns off when a current limit is reached; MOSFET 118 turns on again during the same half cycle when the AC voltage falls sufficiently below that associated with the current limit. MOSFET 116 operates similarly during negative half cycles.

During the simple FPC and RPC modes, MOSFETs 116 and 118 can be driven in alternation as taught in allowed U.S. Pat. No. 5,004,969. The patent has is now issued to Schanin. Independent switching is used to implement AHPC mode. Alternatively, tandem driving can be employed in all modes as taught by U.S. Pat. No. 4,633,161 to Callahan et al. However, tandem operation is subject to zero-crossing detection errors.

The timing of the signals driving switch assembly 102 is generated by phase controller 104. Phase controller 104 has an input for receiving or requested RMS voltage. Phase controller 104 also monitors the switch output voltage. This permits a comparison of actual power to requested power so that power can be regulated. In RPC mode, this regulation permits turn off time to be triggered when the requested power has been delivered on a cycle-by-cycle basis. This permits a constant power output despite significant variations in the AC waveform from source 112. In FPC mode, the regulation is on a delayed basis, so the regulation is somewhat less precise.

Phase controller 104 is "asymmetric" in the sense that it only causes asymmetric waveforms to be delivered to load 114. FPC and RPC waveforms are inherently asymmetric. However, hybrid phase control waveforms can be symmetric as taught by Callahan et al. However, symmetric hybrid waveforms would not properly protect switch assembly 102. Hence, phase controller 104 is limited to providing asymmetric waveforms.

The timing signals so generated trigger drive signals from transition shaper 106, which determines the shape of the transitions imposed by switch assembly 102. The drive signals determine the modulation of AC voltage during a switch transition.

In a manner discussed in the background section above, the transition shaper 106 limits the transition rate (dv/dt) to mimic the action of a magnetic choke in an SCR-type phase controller to minimize noise. However, the dv/dt ratio is not the only factor in dimmer noise. The rate of change of the voltage transition time, or $dv^2/dt^2$, is a significant contributor to the noise generated by the lamp, as well as radiated and conducted electrical noise. When the transition is a straight line, sharp transitions occur at both the start point and end point. These sharp transitions contribute significantly to noise. Transition shaper 106 ensures a negative average second derivative in the transition drive signals to minimize sharp transitions, and thereby further minimize noise. As discussed below in conjunction with asymmetric waveform selector 110, transition shaper 106 also provides for both a long mode and a short mode of operation.

Switch protector 108 monitors current, voltage, and temperature to detect circuit threatening conditions. Voltage can be monitored to determine its amplitude in order to indicate an overvoltage and to determine its shape in order to detect excessive noise. In extreme and persistent conditions, switch protector 108 can trigger a decoupling of load 114 from source 112, turning by switch assembly 102 off.

In accordance with the present invention, circuit-condition data from switch protector 108 is provided to asymmetric waveform selector 110 so it can trigger a waveform change to avert a shutdown, minimize the adverse consequences of a circuit-threatening condition, and/or minimize side effects of a response thereto by switch protector 108.

Figures 2, 3, 4:
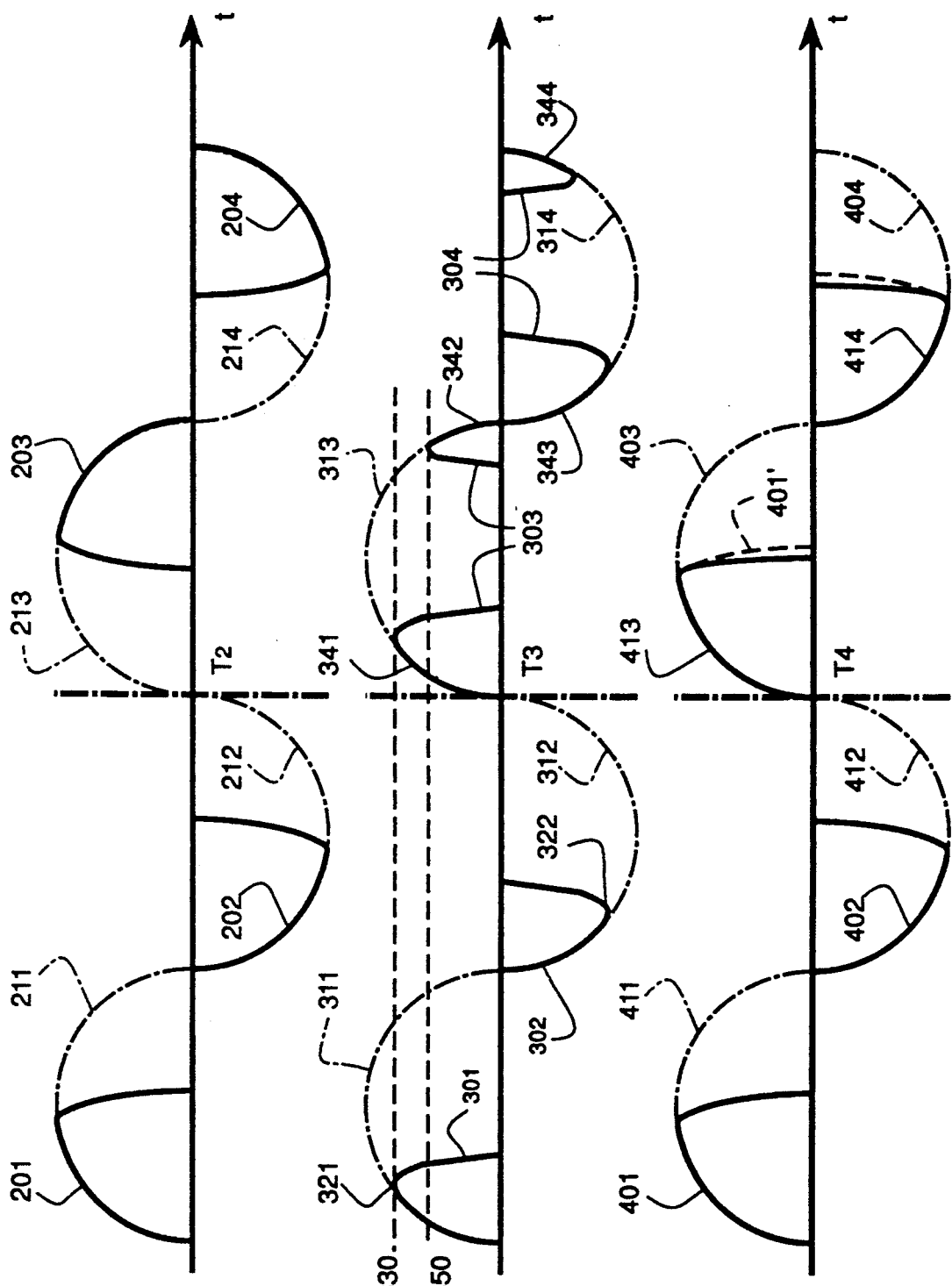
FIG. 2 is a waveform diagram representing a response to an overcurrent in accordance with the present invention.
FIG. 3 is a waveform diagram representing a response to an overvoltage in accordance with the present invention.
FIG. 4 is a waveform diagram representing a response to heat accumulation in accordance with the present invention.

In response to an overvoltage, asymmetric waveform selector 110 directs phase controller 104 to change from RPC mode to FPC mode, as indicated in FIG. 2. Four half cycles 201, 202, 203 and 204 of a load voltage are shown superimposed on four half cycles 211, 212, 213, and 214 of a source voltage. The first positive half cycle 201 and succeeding first negative half cycle 202 are shown in RPC mode. The second positive-half cycle 203 and the second negative half cycle 204 occur after a waveform change around time T2 to FPC mode as indicated.

In response to an overcurrent, asymmetric waveform selector 110 directs phase controller 104 to change from RPC mode to AHPC mode, as indicated in FIG. 3. Four half cycles 301, 302, 303 and 304 of a load voltage are shown superimposed on four half cycles 311, 312, 313, and 314 of a source voltage. The first positive half cycle 301 and succeeding first negative half cycle 302 are shown in RPC mode. The turn offs at 321 and 322 are forced since the current limit is reached. After several such cycles, the load voltage waveform is changed around time T3 to AHPC mode. Second positive cycle 303 of the load voltage has a positive RPC component 341 and a positive FPC component 342. Likewise, second negative cycle 304 has a RPC and FPC components 343 and 344. The turn on for positive FPC components 342 occurs as input cycle 313 drops below a confidence threshold 350 that is enough below current limit 330 to guarantee an overcurrent cannot reoccur during the present half cycle. Thus, the peak for FPC component 342 is necessarily below that of RPC component 341, rendering hybrid waveform 303 asymmetric. Hybrid waveform 304 is similarly asymmetric.

In response to an excessive temperature, asymmetric waveform selector 110 directs transition shaper 106 to change from long transition mode to short transition mode, as indicated in FIG. 4. Again, load voltage half cycles 401, 402, 403 and 404 are shown superimposed on source voltage half cycles 411, 412, 413 and 414. The change of operational mode occurs around time T4. Half cycle 403 illustrates a shortened transition time. This half cycle is imposed on a copy 401' of first half cycle 401 to illustrate the change in transition time. Switch protector 108 also monitors instantaneous voltage during switch transitions, causing transition shaper 106 to instantaneously modify a drive signal to achieve the desired transition shape in the output power signal.

Figure 5:
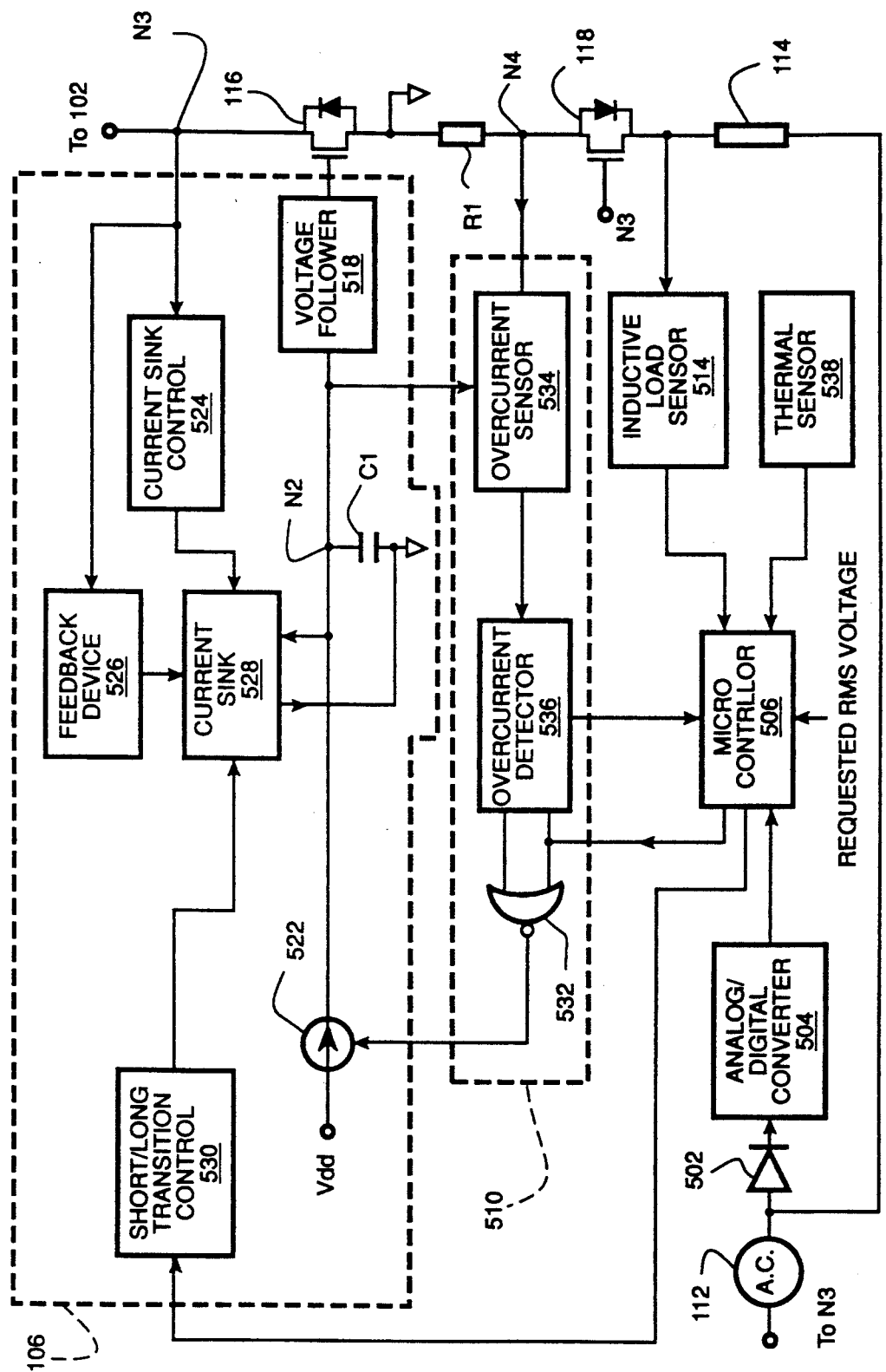
FIG. 5 is a schematic of the phase-controlled power modulation system of FIG. 1.
Figure 6:
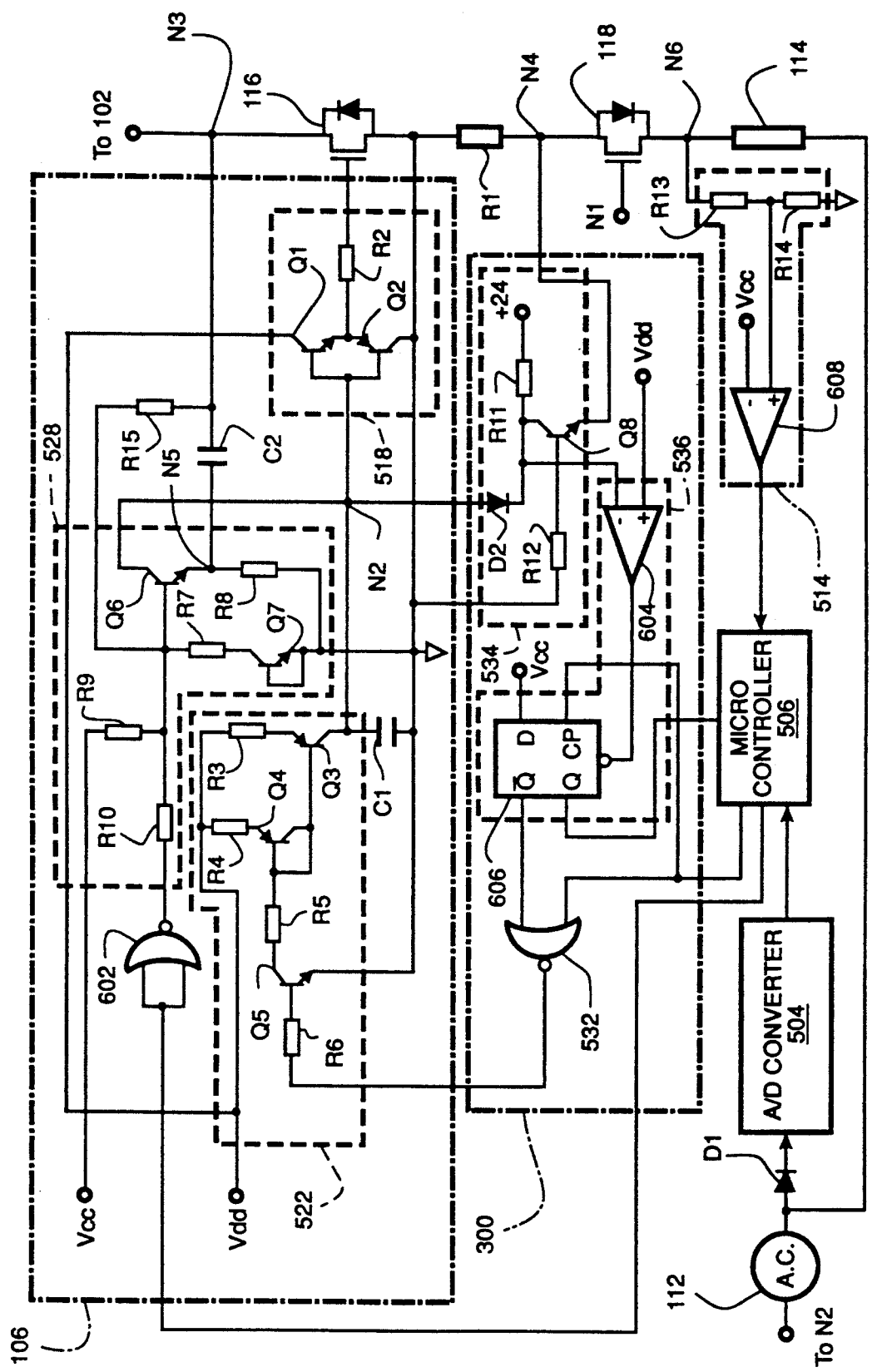
FIG. 6 is a circuit diagram of the phase-controlled power modulation system of FIG. 1.

The preferred embodiment of the present invention is described more structurally with reference to FIGS. 5 and 6. In relating the structural description to the functional description, it should be recognized that the correspondence of functional elements to structural elements is not one-to-one. In some cases, multiple functions are performed by a single component. For example, waveform selection and phase control are both primarily implemented by the same microcontroller. In other cases, one function can be implemented by a combination of structural elements. For example, the switch protector function utilizes a resistor to aid in detection of an overcurrent and a thermal sensor to aid in detection of overheating. Those skilled in the art can make the appropriate correspondence between structure and function.

The basic structure of phase-controlled power modulation system 100 is illustrated in FIG. 5. A diode D1 passes only the negative half-cycles of the voltage output from AC source 112. An analog-to-digital (A/D) convertor 504 converts the negative half cycle into a digital representation. A microcontroller 506 squares and integrates these half-wave digital representations of the analog input to compute its cumulative RMS voltage. The calculated cumulative RMS voltage is compared with a previously computed target RMS voltage that represents the RMS voltages to be provided by AC source 112 before MOSFET 116 is turned off (in RPC mode) or on (in FPC mode). The target value is calculated from an externally supplied requested RMS voltage value.

When the cumulative value is equal to the target value, microcontroller 506 provides a control signal to a transition controller 508 via an overcurrent detector 510. Transition controller 508 receives this control signal and switches the conductive state of MOSFET 118 off or on through control of its gate. MOSFET 116 is operated during the positive cycle in a mirror fashion by microcontroller 506, by its setting of a one-half cycle timer (of microcontroller 506) when the cumulative RMS voltage reaches the target RMS voltage during the negative cycle. A half-cycle period is 8.33 ms long in a 60 Hz system, and 10 mS long in a 50 Hz system. This timer will then expire at the same phase angle in the positive cycle as it was when set during the negative cycle, interrupting microcontroller 506 and causing it to change the state of MOSFET 116 as required by the operating mode of phase-controlled power modulation system 100.

Microcontroller 506 controls the operational modes of system 100. System 100 normally operates in RPC mode, whereby MOSFET 118 is always conducting during the positive half cycle when it will be reverse biased, so it can begin conduction when the negative half cycle begins and it becomes forward biased. However, when operating in FPC mode, MOSFET 118 is only enabled at the target RMS voltage, and is turned off sometime during the positive half cycle when it is reverse biased. In addition, microcontroller 506 controls system 100 to operate in AHPC mode during an overload or an incandescent lamp warm-up, as will be discussed in detail below.

Overcurrent detector 510 is connected to the gates of MOSFETS 116 and 118 via transition controller 508. Overcurrent detector 510 is also coupled to a sense resistor R1 and microcontroller 506. When the voltage generated across sense resistor R1 exceeds a predetermined limit value, overcurrent detector 510 overrides microcontroller 506 and causes transition controller 508 to switch off the forward biased MOSFET 116, thereby protecting it from damage due to overcurrent. Concurrently, overcurrent detector 510 signals microcontroller 506. If the current mode of operation is RPC, microcontroller 506 uses this signal to determine whether it should change to AHPC mode. If the overcurrent condition persists for a predetermined duration, e.g., several seconds, in AHPC or FPC mode, the system 100 can shut down temporarily and retry later, for example, five seconds later.

An inductive sensing circuit 514 is connected between load 114 and microcontroller 506. When system 100 is operating in RPC mode, inductive system elements may generate voltage transients back to MOSFET 118 and are detected by inductive sensing circuit 514. Under such conditions, inductive sensing circuit 514 sends a signal to microcontroller 506 which debounces this input signal. When a predetermined threshold of a consecutive number of inductive sense signals is reached, the timing of the signals generated by microcontroller 506 to transition controller 508 is modified so that system 100 operates in FPC mode.

Transition controller 508 includes a voltage follower 518, a capacitor C1, a controlled current source 522, a dynamic current sink control 524, a feedback device 526, a current sink 528, and a short/long transition control 530.

In accordance with the present invention, MOSFET 118 is controlled via nodes N1 and N6 by circuit components equivalent to transition controller 508 and to overcurrent detector 510. Due to the equivalency, these components are not illustrated nor is their operation described in detail. Their operation can be extrapolated from the operational description of transition controller 508 and to overcurrent detector 510 below.

An overview of the basic operation of these circuits follows. Current sink 528 is coupled to a node N2 to provide capacitor C1 with stable discharge voltage. Current sink 528 is always enabled, continually sinking current, and therefore always attempting to completely discharge capacitor C1. This ensures that MOSFET 116 is kept off during power-up initialization.

When microcontroller 506 determines that MOSFET 116 must begin conduction, it enables current source 522. Current source 522 is much stronger than current sink 528, and therefore the voltage across capacitor C1 rises. Voltage follower 518 ensures that the voltage across capacitor C1 is mirrored at the gate of MOSFET 116, which therefore becomes conductive when the voltage at its gate exceeds its turn-on threshold.

When microcontroller 506 determines that MOSFET 116 should become non-conductive, current source 522 is disabled. This allows current sink 528 to discharge capacitor C1, and, through voltage follower 518, drive the gate voltage of MOSFET 116 below its threshold, rendering it non-conductive. Note, therefore, that the simple control of current source 522 is all that is required to control the conductive state of MOSFET 116. Also note that a NOR gate 532, which by virtue of being driven by inverted logic, functions as an AND gate, allowing either microcontroller 506 or overcurrent detector 510 to turn-off current source 522, and therefore terminate conduction by MOSFET 116.

The operation of current sink 528 is dynamically modified by feedback device 526 and dynamic current sink control 524, and is statically modified by short-/long transition control 530. Dynamic current sink control 524 and feedback device 526 are coupled to node N3 to provide input to current sink 528 regarding voltage changes (feedback device 526) and the absolute voltage (current sink control 524) across MOSFET 116. The half-wave DC signal at node N3 is attenuated by dynamic current sink control 524 and is supplied at its output.

Feedback device 526 provides a negative feedback signal that adjusts current sink 528 to sink substantially less current when MOSFET 116 enters its active region, so as to allow for the lengthy transition period. Dynamic current sink control 524 increases the current sunk by current sink 528 as the voltage rises across MOSFET 116. This ensures that the load voltage undergoes a very gradual transition as MOSFET 116 enters its active regions. The gradual transition corresponds to a small $dv^2/dt^2$, minimizing noise. Preferably, the voltage change during the fourth quarter duration of a transition is at least twice that of the voltage change during the first quarter. This is made possible using a transition characterized by a negative average second derivative.

The function of short/long transition control 530 is to provide current sink 528 with two selectable base biases to allow it to operate in a long transition mode when switch temperature is low, and a short transition mode when the switch temperature is high.

When current source 522 is disabled, and capacitor C1 is changed all three modifiers to current sink 528 identified above affect the performance, shape, and period of the transition from a conductive state to a non-conductive state of MOSFET 116. Additionally, since current sink 528 is continuously enabled, when stronger current source 522 is enabled and charges capacitor C1, it does so sourcing current against current sink 528, and therefore all of the modifiers that affect current sink 528 have an similar affect on the performance, shape, and period of the transition from a non-conductive state to a conductive state of switch 116. So the configuration described above provides a simple means for ensuring that both turn-on and turn-off of MOSFETs 116 and 118 are uniform, and controlled identically. Note that the combination of these three functions into the continually enabled current sink differs significantly from prior art revealed in U.S. Pat. Nos. 4,540,893 to Bloomer and 4,633,161 to Callahan.

Overcurrent detector 510 includes a sensing section 534, a detection circuit 536 and NOR gate 532. Sensing section 534 is connected to node N4 to detect the voltage across sense resistor R1. When sensing section 534 detects a voltage across sense resistor R1 that exceeds a predetermined threshold, the negative output of section 534 is asserted. Consequently, there is a output from detection circuit 536.

The signal from detection circuit 536 is inverted by NOR gate 532. Current source 522 is thereby switched off by the signal from NOR gate 532 so that capacitor C1 begins its discharge cycle (since current sink 528 is always enabled). Accordingly, the voltage at node N2 decreases, transitioning MOSFET 116 to its non-conductive state.

Thermal sensor 538 is in physical contact with switch assembly 102 to measure its temperature. Microcontroller 506 monitors the output of thermal sensor 538 and compares this output to a predetermined warning threshold. When the warning threshold is exceeded, microcontroller 506 asserts a signal to short/long transition control 530 to effect a change from long to short transition mode. If thermal sensor 538 indicates that the temperature of switch assembly 102 continues to rise above a shutdown threshold, microcontroller 506 shuts switch assembly 102 off by no longer enabling transition controller 508. Microcontroller 506 reenables switch assembly 102 once its temperature falls below the warning threshold.

The circuitry of FIG. 5 is explained in greater detail below with reference to FIG. 6. Voltage follower 518 includes a gate oscillation resistor R2, and transistors Q1 and Q2. Transistors Q2 and Q4 are configured as a voltage follower to mirror the voltage at node N2 to the gate of MOSFET 116. Gate oscillation prevention resistor R2 prevents high frequency oscillations of MOSFET 116. Feedback device 526 includes a capacitor C2, dynamic current sink control 524 includes a resistor R15, and short/long transition control 530 includes a NOR gate 602 and resistor R10.

Controlled-current source 522 includes transistors Q3, Q4 and Q5, and resistors R3, R4, R5 and R6. Current source transistor Q3 and current source resistor R3 are arranged to constitute a constant current source whose bias is established by current source bias resistors R4 and R5. Transistor Q4 is configured as a temperature compensating diode. Transistor Q5 is configured as the current source switch. Upon arrival of a high level signal from NOR gate 532, transistor Q5 is turned on so that constant current source 522 is turned on. Resistor R6 is a current limit resistor for NOR gate 532.

Current sink 528 includes transistors Q6 and Q7 and resistors R7, R8, and R9. Transistor Q6 and resistor R8 form a constant current sink whose bias is established by resistors R7 and R9. Resistor and resistor R15 functions as dynamic current sink control 524, and resistor R10 functions are as short/long transition controller 530. Transistor Q7 is configured as a temperature compensating diode for current sink 528.

Figure 7:
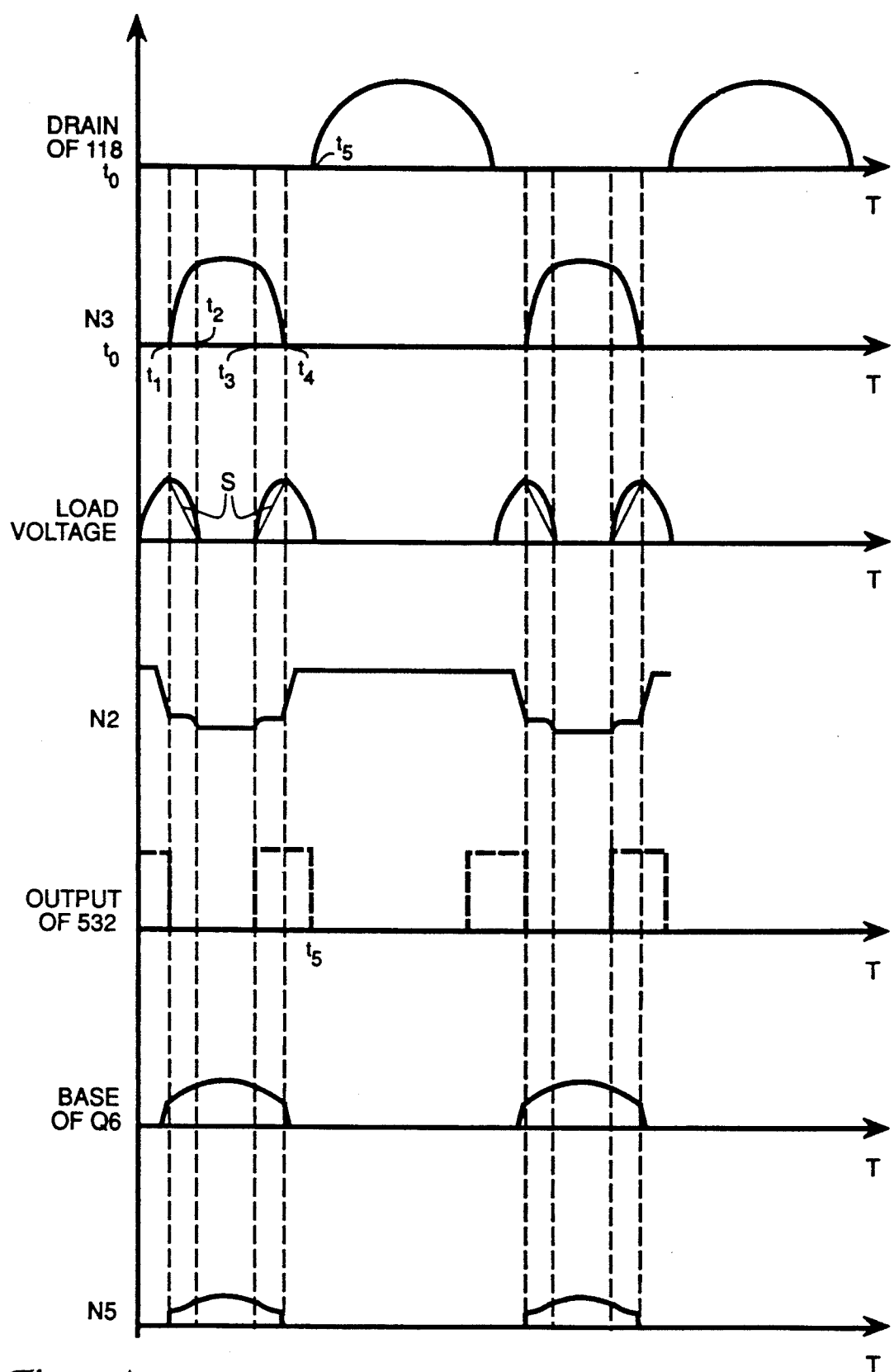
FIG. 7 is a timing diagram for the circuit of FIG. 6.

In the process of bringing MOSFET 116 from a non-conductive to a conductive state, a half wave AC voltage is applied to node N3 at time $t_0$, as indicated in FIG. 7. Because the output of NOR gate 532 is at a high level, transistor Q5 is on so that the output of transistor Q3 charges capacitor C1 to $V_{dd}$ less one diode drop, keeping node N2 at high level. Note that current sink 528 is still enabled, but current source 522 is much stronger and therefore yields a net positive current to charge capacitor C1. Therefore, MOSFET 116 is conductive and the AC voltage at node N3 is applied to load 114.

At time $t_1$, the RMS Voltage to be delivered to load 114 achieves the target value, causing microcontroller 506 to send a high level signal through NOR gate 532 the output of which goes to a low level, to turn switch transistor Q5 off. Capacitor C1 is therefore discharged via transistor Q6 and resistor R8. Capacitor C2 serves as a feedback mechanism that injects additional current into node N5 (at the emitter of transistor Q6) when the voltage at node N3 begins to change. This ensures that the discharge of capacitor C1 slows in the active region of MOSFET 116. The rising voltage at node N3 is attenuated by resistor R3 and increases the bias applied to the base of transistor Q6 and therefore the current sunk by transistor Q6. This technique allows a slow entry into the active region, with a faster exit from said region. The resulting load voltage at node N6 (drain of MOSFET 116) can be seen in FIG. 7 as a gradually sloping waveform with minimal $dv^2/dt^2$.

Accordingly, during the falling transition from time $t_1$ to time $t_2$, the voltage at node N2 keeps MOSFET 116 operating in its active region so that the load voltage waveform is curved, as shown FIG. 7. Prior art circuits, particularly those revealed in U.S. Pat. No. 4,540,893 to Bloomer, only provide sharp transitions that are shown by the straight line waveform S, superimposed on the load voltage in FIG. 7. The straight line waveform means a high $dv^2/dt^2$ of the AC voltage in fall/rise transition time, which contributes to electrical noise.

At time $t_2$, the voltage at node N3 has stopped changing, so a feedback current sink node N5 is no longer injected with extra current. Therefore, transistor Q6 sinks the voltage of capacitor C1 to such an extent that the voltage at node N2 is low enough to drive MOSFET 116 to the non-conductive-state. As a result, no voltage is applied to load 114 and the voltage at node N3 is the AC voltage supplied by AC source 112, as shown in FIG. 7. In RPC mode, the low level applied by NOR gate 532 lasts until some time after $t_5$ at which time MOSFET 116 will be transitioned back to a conductive nonconducting state by microcontroller 506. A similar operation is applied to MOSFET 118 but with the positive and negative phases reversed.

The process of bringing MOSFET 116 into a conductive state from a non-conductive state (as would be done in PC mode) is somewhat similar to that just discussed. When the RMS voltage has reached the target, transistor Q5 is switched on by microcontrol 506 and Q3 begins to charge capacitor C1, which further uniformly raises the voltage applied to the gate of MOSFET 116 through voltage follower 518. Note that current sink 528 is still operating. At time $t_3$, the voltage at node N3 begins to drop because MOSFET 116 is entering its active region. As a result, dynamic current sink control 524 and feedback device 526 both begin to affect current sink 528. The resulting initial decrease in current sunk by current sink 528 due to feedback capacitor C2 is more than offset by the increase in the current sunk due to current source resistor R3, and therefore causes the same $dv^2/dt^2$ elimination and waveform shaping that was described above.

At time $t_4$, the voltage at node N3 has nearly reached zero and has completed its transition, so current sink 528 has had its bias reduced to its lowest level. This allows a smooth transition from the active region to the saturated region. Current source 522 then continues to source current with little opposition to capacitor C1, to charge the latter to $V_{dd}$ less one diode drop.

The preceding description has detailed the operation of MOSFET 116 in both RPC as well as FPC mode. When the system is in AHPC mode, microcontroller 506 simply causes pairs of the above described transitions to occur.

Sensing section 534 includes a transistor Q8, a diode D2, and resistors R11 and R12. The base of Q8 is grounded via resistor R12, which serves as a current-limit resistor. The collector of Q8 is coupled to diode D2 so that the DC bias applied to the collector of Q8 via pull-up resistor R11 is blocked from node N2 and capacitor C1 by diode D2. The emitter of Q8 is coupled to sense resistor R1 via node N4.

A voltage comparator 604 and a flip-flop 606 constitute detection circuit 536. The voltage at node N4 becomes increasingly negative as the current through MOSFET 116 increases. When the voltage differential between ground and node N4 exceeds $V_{be}$ of transistor Q8, it conducts and attempts to discharge capacitor C1 through diode D2. The reference voltage of comparator 604 is $V_{dd}$, the same voltage used by current source 522 to charge capacitor C1.

When transistor Q8 turns on, regardless of the charge on capacitor C1, its collector drops to a minimum level of $V_{dd}$ less two diode drops (one drop from Q3 and one from D2). If the overcurrent fault causes significant dv/dt sensing section 534 also discharges node N2 at a rate faster than that current sink 528 is normally capable of. This enhances the state change of MOSFET 116 from fully saturated to its active region and the start of the transition to a non-conductive state. The double diode drop assures that comparator 604 asserts its output low anytime transistor Q8 turns on; the low output resets flip-flop 606 so that its $\overline{Q}$ output goes high. NOR gate 532 therefore provides a low level output to Q5, turning it off and stopping current source 522 from charging capacitor C1. The constantly enabled current sink 528 thus starts the discharge cycle of capacitor C1.

When required to turn MOSFET 116 on, microcontroller 506 asserts the low input to NOR gate 532 and the clock input CP of flip-flop 606. This forces its $\overline{Q}$ output to go low due to a high D input. The low level at output $\overline{Q}$ is NORed with the low level from microcontroller 506 at NOR gate 532, providing a high level signal to turn Q5 on.

To turn MOSFET 116 off, a high level output from microcontroller 506 is applied to one input of NOR gate 532. Note that although this signal is also applied to clock input CP of flip-flop 606, it has no effect since flip-flop 606 is falling-edge triggered. The high level output is applied to the input of NOR gate 532, providing a low output that turns Q5 off.

Inductive sensing circuit 514 includes divider resistors R13 and R14, and a voltage comparator 608. The voltage across load 114 is applied to divider resistors R13 and R14, providing an attenuated voltage at the positive input of comparator 608. A reference voltage Vcc is applied to the negative input of comparator 608. When the load is inductive, the spike voltage at node N6 is higher than the reference voltage so comparator 608 interrupts microcontroller 608 with a rising edge comparator output.

To confirm that this load is inductive, microcontroller 506 counts the number of consecutive AC cycles that have outputs from comparator 608 until it reaches a predetermined count. Any one cycle without a signal resets the counter. If the predetermined count has been reached, microcontroller 506 modifies the timing of the signals, which drives overcurrent detector 510 to operate system 100 in FPC mode.

Microcontroller 506 performs a real-time accumulated RMS voltage calculation using a step-wise square and integration. An integration target value is calculated from a requested RMS value input to microprocessor 506. The accumulated RMS voltage is repeatedly compared with the target value. When the target is reached, appropriate action based on the system's mode is taken, but the RMS calculation continues until no additional voltage is available for integration. This last step allows the recording of the RMS voltage available from AC source 112.

The calculated integration target value differs from the requested RMS value to account for additional RMS accumulation during shut off, which is not instantaneous. Indeed, there are three types of delays that are encountered before the voltage at the load is reduce to zero: the transition period, additional hardware delays in the various elements, and software delays inherent in executing instructions and servicing interrupts. While the last two items are basically fixed delays, the energy delivered to the load as a function of them can vary based on the absolute voltage at transition time. While the RMS voltage accumulated when the peak voltage is very low is small in absolute terms, it may be large when compared to the energy delivered to the load. The same holds true for delays that occur at high peak voltages. In addition, the energy contained in the transition period, which occurs after the integration target has been reached, can also vary based on the peak voltage at the time of transition.

It is therefore necessary that the target RMS voltage reflect a correction to the requested RMS voltage. The target value can be calculated using the following equation:

$$T = RMS \pm C$$

where T is the target value, RMS is the value of the RMS voltage requested to be delivered to the load, and C is the correction value. Whether correction value C is added to or subtracted from the requested RMS value depends on the operational mode of phase control system 100. In RPC mode, the target value T is RMS minus C. Alternatively, the target value is RMS plus C in PC mode. This target value is subtracted from the total RMS voltage available from source 112 to create the integration target.

Different transition times can be accounted for by adjusting the correction value C. A transition time correction table with different correction values C is stored in microcontroller 506. Different correction values can reflect differences waveform shape, transition times, and various hardware and software delays. When both the input voltage and the requested RMS voltage are determined, the correction value corresponding to the RMS value of the waveform can be obtained from the correction table.

A/D converter 504 converts the output of the AC source 112 into digital signals. Microcontroller 506 further squares and integrates each digital sample during the negative half cycle. The resulting cumulative value is compared with the target value in microcontroller 506. If the target value has been reached, the drive signals to MOSFETs 116 and 118 are complemented. Therefore, regardless of whether the system is in RPC or FPC mode, each MOSFET is correctly transitioned from one conductive state to the other.

If the accumulated RMS voltage is increasing but has not reached the target value, microcontroller 106 continues to monitor voltage to calculate the RMS voltage delivered to the load. If the RMS voltage calculated to this point is zero, this indicates that the AC voltage from AC source 112 has not yet transitioned to the negative half cycle, so monitoring and calculation continue.

When the calculated RMS voltage has not changed in the last 0.5 milliseconds (ms), this indicates that the RMS voltage from the AC source 112 has passed the transition point to a positive half cycle, and is somewhere in the positive half cycle. Therefore, integration of the negative cycle RMS voltage is terminated since it cannot yield further increases or changes until the next negative half cycle. The calculated RMS value, which represents the AC source output voltage, is recorded. Note that it is possible the target RMS voltage is never met, as would be possible in a situation where system 100 is in RPC mode and the input AC line voltage has sagged. Where a failure to reach the target occurs, MOSFET 118 which was reversed biased due to the system being in the negative half cycle, is held in to the conductive state. In this case, the system 100 delivers the maximum RMS voltage available from AC source 112.

A timer interrupt is scheduled for exactly one half cycle after the target is reached (8.33 Ms in a 60 Hz system, 10.0 Ms in a 50 Hz system) so that the MOSFET 116 has its state changed at exactly the same position in the positive half cycle as MOSFET 118 had its state changed in the negative half cycle. Following the timer scheduling, the integration process for the RMS voltage is resumed. The total voltage value applied to the load during one half cycle of AC voltage is recorded by microcontroller 506.

Operation in AHPC mode is somewhat more complex. When overcurrent detector 510 signals an interrupt indicating that overload shutdown has occurred, microcontroller 506 records the absolute voltage of the AC waveform at which the overload occurs, and calculates the voltage at which the MOSFET should be re-enabled. This re-enable voltage is a function of the overload voltage. The re-enable voltage must be lower than the overload voltage to avoid a second overload shutdown, since the lamp filament cools during the period of no conduction, and will therefore have a lower impedance and draw higher current at the voltage. In general, the lower the turn off voltage, the higher the differential must be between the overload voltage threshold and the re-enable voltage threshold. The implementation of an asymmetric hybrid phase control mode provides for the required differential between the overload voltage threshold and the re-enable voltage threshold. Since no voltage sensing capability exists during the positive half cycle, a timer records the time period of non-conduction during the negative half cycle by the MOSFET (that is, until the re-enable voltage is reached) to be used during the positive half cycle by microcontroller 506.

The present invention provides for many alternatives to the preferred embodiment described above. Different switch types are provided for. The primary operating mode can be RPC, FPC or an alternative mode. Power control applications other than dimming of lighting fixtures are provided for. These and other modifications to and variations upon the preferred embodiments are provided for by the present invention, the scope of which is limited only by the following claims.

What is claimed is:

1. A phase-controlled power modulation system for modulating the power delivered to a load from an AC source, said system comprising:

a switch assembly for controlling the voltage across said load, said switch assembly being between said load and said AC source, said switch assembly having at least two alternative conduction states;

a transition shaper for controlling the rate of change of voltage applied across said load when said switch assembly changes states, said transition shaper being coupled to said switching assembly;

a phase controller for controlling said switch assembly to implement phase control of said power, said phase controller determining the timing of transitions of said switch assembly, said phase controller being coupled to said transition shaper for triggering switch transitions;

a switch protector for protecting said switch assembly in response to a circuit-threatening condition, said switch protector including detector means for detecting said circuit-threatening condition; and an asymmetric waveform selector for selecting between a normal operational mode characterized by a normal mode asymmetric waveform and a protective mode characterized by a protective mode asymmetric waveform, said protective mode asymmetric waveform being different from said normal mode asymmetric waveform, each protective waveform being shaped so that the power delivered through said switch assembly during the first 90° AC half cycle is different from the power delivered through said switch assembly during last 90° of the same AC half cycle, said asymmetric waveform selector being coupled to said switch protector for determining when to switch between said normal and protective modes, said asymmetric waveform selector being coupled to said phase controller and/or to said transition shaper for implementing a selected mode.

2. A phase-controlled power modulation system as recited in claim 1 wherein said detector means detects an overvoltage condition across said load, said asymmetric waveform selector causing a mode change from a normal reverse phase control mode to a protective forward phase control mode in response to this detection.

3. A phase-controlled power modulation system as recited in claim 1 wherein said detector means detects an overcurrent condition through said switch assembly, said switch protector limiting the voltage across said load in response to this detection, said asymmetric waveform selector causing a mode change from a forward or reverse normal phase control mode to a protective asymmetric hybrid control mode in response to said detection.

4. A phase-controlled power modulation system as recited in claim 1 wherein said detector means detects an excessive temperature around said switch assembly, said asymmetric waveform selector causing said transition shaper to change from a normal long transition time mode to a protective short transition time mode in response to said detection.

5. A phase-controlled power modulation system as recited in claim 1 wherein said transition controller causing the transition time during a protective mode to be the same as the transition time during the immediately preceding period of normal operation.

6. A phase-controlled power modulation system for controlling the power delivered to a load from an AC source, said system comprising:
- a switch assembly for controlling the voltage across said load, said switch assembly being between said load and said AC source;
- a phase controller for driving said switch assembly to implement phase control of said power, said phase controller driving said switch assembly so that the RMS voltage delivered through said switch assembly during any given quarter AC cycle is different from the RMS voltage delivered through said switch assembly during the next quarter AC cycle, said phase controller being coupled so as to said switch assembly to effect said driving;
- a voltage limiter for limiting said voltage in response to a circuit-threatening condition, said voltage limiter including detector means for detecting said circuit-threatening condition, said voltage limiter being coupled to said switch assembly to effect limiting of said voltage; and
- transition control means for effecting a load-voltage transition profile with a negative average second derivative.

7. A phase-controlled power modulation system for controlling the power delivered to a load from an AC source, said system comprising:
- first and second voltage-controlled switches for controlling the current flow through said load, said switches being in inverse series connection between said load and said AC source;
- analog-to-digital conversion means for encoding an analog waveform, said analog-to-digital conversion means coupling to said AC source for receiving said analog waveform therefrom, said analog-to-digital conversion means having a digital output at which it supplies a digital representation of said analog waveform;
- processing means for calculating RMS voltage and for determining the operational mode of said voltage-controlled switches, said processing means coupling to the output of said analog-to-digital conversion means for squaring and integrating said digital representation to provide a calculated RMS voltage, said processing means having a digital output at which it supplies a trigger signal when said calculated RMS voltage achieves a predetermined value; and
- transition control means for controlling operation of said voltage-controlled switches in their respective active regions during a transition, said transition control means having a trigger input, a voltage input and a switching control output, said trigger input coupling to said digital output of said processing means, said voltage input coupling to said AC source, and said switching control output coupling to said voltage-controlled switches, said transition control means providing a transition control signal at said switching control output in response to said trigger signal, said transition control signal keeping each of said voltage-controlled switches operating as its active region during said transition so that a load voltage waveform across said load is curved.

8. A phase-controlled power modulation system for controlling the power delivered to a load from an AC source, said system comprising:
- first and second voltage-controlled switches for controlling the current flow through said load, said switches being in inverse series connection between said load and said AC source;
- analog-to-digital conversion means for encoding an analog waveform, said analog-to-digital conversion means coupling to said AC source for receiving said analog waveform therefrom, said analog-to-digital conversion means having a digital output at which it supplies a digital representation of said analog waveform;
- processing means for calculating RMS voltage and for determining the operational mode of said voltage-controlled switches, said processing means coupling to the output of said analog-to-digital conversion means for squaring and integrating said digital representation to provide a calculated RMS voltage, said processing means having an digital output at which it supplies a trigger signal when said calculated RMS voltage achieves a predetermined value; and
- transition control means for controlling operation of said voltage-controlled switches in their respective active regions during a transition, said transition control means having a trigger input, a voltage input and a switching control output, said trigger input coupling to said digital output of said processing means, said voltage input coupling to said AC source, and said switching control output coupling to said voltage-controlled switches, said transition control means providing a transition control signal at said switching control output in response to said trigger signal, said transition control signal keeping each of said voltage-controlled switches operating at its active region during said transition so that a load voltage waveform across said load is curved, said transition means including
- controlled current source means for supplying a constant current, said controlled current source means having a controlled input, said controlled input being coupled to said processing means so that said state of controlled current source means is changed by said trigger signal when said calculated RMS voltage equals said predetermined value,
- a capacitance element for providing said transition control signal to said first voltage-controlled switch, said capacitance element being coupled to said controlled current source means and said first voltage-controlled switch so that said controlled current source means charges said capacitance element while said controlled current source means stays on,
- a voltage follower for mirroring the voltage potential on said capacitance element to said first voltage-controlled switch,
- dynamic current sink control means for providing a dynamic current, said dynamic current sink control means having an input and an output, said input coupling to said AC source, said dynamic current sink control means providing said dynamic current at its output, said dynamic current being in phase with said AC signal, current sink means for discharging said capacitance element, said current sink means having a dynamic current input, a feedback current input and a discharge port, said dynamic current input coupling to the output of said dynamic current sink control means for receiving said dynamic current, said discharge port coupling to said capacitance element, and feedback means for providing a feedback signal, said feedback means having an input coupled to said AC source, said feedback device having an output coupled to said current sink means to provide a feedback signal that modifies the sink current flow through said current sink means, said dynamic current dynamically offsetting said current sink means so that said current sink means discharges said capacitance element in response to said trigger signal to cause said load voltage waveform to be curved.

9. A system as recited in claim 8, wherein said transition control means further comprises long/short transition control means, said long/short transition control means having an input and an output, the input of said long/short transition control means coupling to said processing means so that when said first voltage-controlled switch is thermally overloaded, said processing means first determines in which operational mode said first voltage-controlled switch is operating, and if said voltage-controlled switch is operating in a reverse phase control mode, said processing means causing said long/short transition control means to send a signal that accelerates said current sink means to discharge said capacitance element so that said first voltage-controlled switch is operating in a phase control mode, said processing means causing said long/short transition control means to send a signal that blocks said current sink means from discharging said capacitance element so that said first voltage-controlled switch is turned on quickly.

10. A system as recited in claim 8, wherein said dynamic current sink control means is a resistance element.

11. A system as recited in claim 9, wherein said short-/long transition control means includes a resistance element.

12. A system as recited in claim 8, wherein said feedback device is a capacitance element.

13. A system as recited in claim 8 comprising an overcurrent detection means arranged between said processing means and said transition control means, said overcurrent detection means coupling to said voltage-controlled switches via a sensing element, said overcurrent detection means coupling to said processing means for providing a switching signal to said transition control means when an overcurrent occurs, said switching signal turning said controlled current source off so that said capacitance element is discharged by said current sink means.

14. A system as recited in claim 13 wherein said overcurrent detection means comprises:

sensing means for detecting overcurrent, said sensing means coupling to said sensing element to provide a sensing signal at its output when overcurrent occurs;

detecting means for comparing said sensing signal with a predetermined threshold and providing a comparison output when said sensing signal is higher than said predetermined threshold, said detecting means having comparing means for comparing said predetermined threshold with said sensing signal, said comparing means generating said comparison output when said sensing signal is over said predetermined threshold, and flip-flop means for providing two complementary logic outputs, said flip-flop means generating a first logic output and a second logic output in response to said comparison output, said first logic output being applied to said processing means to establish a phase control operational mode when overcurrent occurs; and a logic gate for providing said switching signal, said switching signal being coupled to said controlled current source means in response to said second logic output and said trigger signal from said processing means.

15. A system as recited in claim 8 further comprising an inductive sensing means, said inductive sensing means providing a sense signal output to said processing means every time the voltage across said load is over a reference potential, and when successive pulse outputs reach a predetermined number, said processing means sending said trigger signal to switch the operational mode of said voltage-controlled switches to a phase control operational mode.

16. A system as recited in claim 8 wherein in the warm-up period of said load, said processing means turns said voltage-controlled switch off at the moment that said AC voltage rises to an overcurrent-threatening voltage, and said processing means turns said voltage-controlled switch on again at the moment that said AC voltage falls to a predetermined value below said overcurrent-threatening voltage so that two power pulses are applied to said load during a half cycle of AC voltage.

17. A phase-controlled power modulation system for controlling the phase angle of current flow through a load from an alternating current (AC) source, said system comprising:

a pair of voltage-controlled switches for controlling the current flow through said load, said switches including a first voltage-controlled switch and a second voltage-controlled switch that are in inverse series connection between said load and said AC source;

an analog-to-digital (A/D) conversion means for converting an analog signal from said AC source into digital signals, said A/D conversion means coupling to said AC source and supplying digital output signals;

processing means for calculating RMS voltage and for determining the operational mode of said voltage-controlled switches, said processing means coupling to the output of said A/D conversion means for calculating the root-mean-square (RMS) value of the digital output signals, said processing means calculating said RMS value that is compared with a predetermined value, when said RMS value equals said predetermined value, said processing means sending a control signal to turn said first voltage-controlled switch off, said processing means calculating a transition phase angle of said second voltage-controlled switch on the basis of said transition phase angle of said first voltage-controlled switch, said processing means monitoring thermal overload of said voltage-controlled switches, and when thermal overload occurs, said processing means providing said control signal to quickly transition said voltage-controlled switches so that the thermal overload is moderated;

overcurrent detection means for detecting overcurrent, said overcurrent detection means coupling to said processing means, and when overcurrent occurs or said overcurrent detection means receives said control signal from said processing means, said overcurrent detection means sending a trigger signal; and transition control means for controlling said voltage-controlled switches to operate at their respective active regions during a transition so that the voltage waveform applied to said load is curved to reduce noise, said transition control means having controlled current source means for supplying a stable current, said controlled current source means having a controlled input, said controlled input coupling to said overcurrent detection means to receive said trigger signal that determines the operational mode of said controlled current source means, a capacitance element for providing said transition control signal to said first voltage-controlled switch, said capacitance element coupling to said controlled current source means and the gate of said first voltage-controlled switch, said capacitance element being charged by said controlled current source means, a voltage follower for mirroring the voltage potential on said capacitance element to the gate of said first voltage-controlled switch, dynamic current sink control means for providing a dynamic control output, said dynamic current sink control means having an input and an output, said input coupling to said AC source, said dynamic current sink control means providing said dynamic control output, a feedback device for providing a feedback signal, said feedback device having an input coupled to said AC source, said feedback device having an output for providing a feedback signal, current sink means for discharging said capacitance element, said current sink means having a dynamic current input, a feedback current input and a discharge port, said dynamic current input coupling to the output of said dynamic current control means, said feedback current input coupling to the output of said feedback device, said discharge port coupling to said capacitance element, said dynamic current and said feedback current dynamically modifying the current through said current sink means, and long/short transition control means for controlling the sink current of said current sink means, said long/short transition control means having an input an output, said input coupling to said processing means, said output coupling to said current sink means, when said first voltage-controlled switch produces thermal overload, said processing means provides a signal to said long/short transition control means to change the sink current, when said first voltage-controlled switch is operating during a fall transition of reverse phase control operational mode, the output signal of said processing means causes said long/short transition control means to send a signal that accelerates said current sink means to discharge said capacitance element so that said first voltage-controlled switch is turned off quickly, and when said first voltage-controlled switch is operating during a rise transition of phase control operational mode, said processing means causes said long/short transition control means to send a signal that blocks said current sink means from discharging said capacitance element so that said first voltage-controlled switch is turned on quickly.

18. A system as recited in claim 17 wherein when said load operates during a warm-up period, said processing means turns off said first voltage-controlled switch at the time AC voltage across said first voltage-controlled switch rises to an overcurrent-threatening voltage, turns on said first voltage-controlled switch at the time AC voltage falls to a predetermined value below said overcurrent-threatening voltage in a first half cycle, records the phase angles at which said first voltage-controlled switch is turned off and on, and switches on said second voltage-controlled switch during the second half cycle as a function of the recorded phase angles.

19. A system as recited in claim 17 further comprising an inductive sensing means, said inductive sensing means having its detection input coupled to said load, said inductive sensing means providing a sense signal output to said processing means when it detects an inductor, said processing means sending said control signal to said controlled current source means to transition said voltage-controlled switches to operate in a forward phase control (FPC) mode.

20. A system as recited in claim 17, wherein said processing means transitions said voltage-controlled switches in a first half cycle, measures the frequency of said first half cycle, and calculates the delay time to the transition of said second voltage-controlled switch so that said first and second voltage-controlled switches are 180° out of phase.

21. A phase-controlled power modulation system as recited in claim 1 wherein said transition controller effects a load-voltage transition profile with a negative average second derivative.

22. A phase-controlled power modulation system for controlling the power delivered to a load from an AC source, said system comprising:

a switch assembly for controlling the voltage across said load, said switch assembly being between said load and said AC source;

a phase controller for driving said switch assembly to implement phase control of said power, said phase controller driving said switch assembly so that the RMS voltage delivered through said switch assembly during any given quarter AC cycle is different from the RMS voltage delivered through said switch assembly during the next quarter AC cycle, said phase controller being coupled so as to said switch assembly to effect said driving; and transition control means for effecting a load-voltage transition profile with a negative average second derivative.

23. A phase-controlled power modulation system as recited in claim 7 further wherein said processing means calculates said predetermined value as a function of the RMS value of said AC waveform, said RMS voltage to be delivered to said load and as a function of the duration of said transition.

* * * * *